United States Patent

[11] 3,604,944

[72] Inventors James L. Gundersen
Carson;
Stephen P. F. Ma, Santa Monica, both of, Calif.

[21] Appl. No. 27,081
[22] Filed Apr. 9, 1970
[45] Patented Sept. 14, 1971
[73] Assignee Hughes Aircraft Company
Culver city, Calif.

[54] MOSFET COMPARATOR CIRCUIT
3 Claims, 1 Drawing Fig.

[52] U.S. Cl. .......... 307/205, 307/215, 307/216, 307/279, 307/304
[51] Int. Cl. .......... H03k 19/08
[50] Field of Search .......... 307/205, 221 C, 251, 215, 279, 216, 304; 330/30 D, 35

[56] References Cited

UNITED STATES PATENTS

| | | | |
|---|---|---|---|
| 3,252,011 | 5/1966 | Zuk | 307/216 X |
| 3,299,291 | 1/1967 | Warner, Jr. et al. | 307/215 X |
| 3,365,707 | 1/1968 | Mayhew | 307/205 X |
| 3,439,185 | 4/1969 | Gibson | 307/205 |
| 3,475,621 | 10/1969 | Weinberger | 307/215 |
| 3,479,523 | 11/1969 | Pleshko | 307/215 X |
| 3,500,062 | 3/1970 | Annis | 307/251 X |

*Primary Examiner*—Stanley T. Krawczewicz
*Attorneys*—James K. Haskell and Bernard P. Drachlis

ABSTRACT: A metal oxide semiconductor field-effect transistor (MOSFET) digital comparator circuit of a type that can be constructed on a single semiconductor substrate. The circuit includes a series of exclusive OR gates, each of which accepts one bit from each of the binary words being compared. The exclusive OR gates provide an output signal when the bits being compared are not the same. The output signals from each of the exclusive OR gates are applied to a MOSFET NOR gate which will provide an output signal when all of the bits compare.

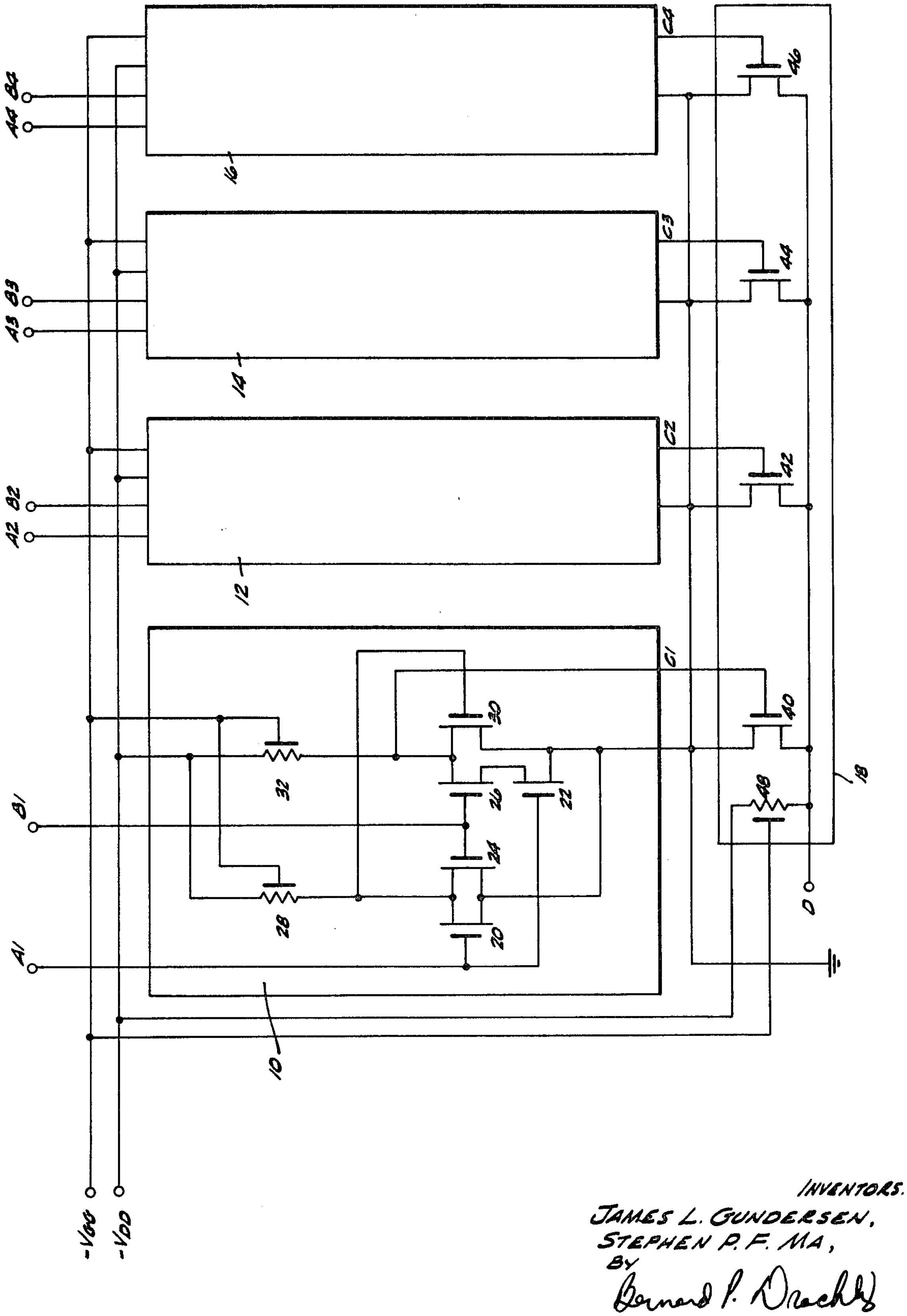
INVENTORS.
JAMES L. GUNDERSEN,
STEPHEN P. F. MA,
BY
Bernard P. Drachlis
ATTORNEY.

MOSFET COMPARATOR CIRCUIT

BACKGROUND OF THE INVENTION

This invention relates generally to semiconductor circuits and more particularly to a digital comparison circuit constructed using metal oxide semiconductor field-effect transistor (MOSFET) techniques.

Common prior art comparator circuits are standard diode transistor logic integrated circuit combinations to provide the necessary comparison.

SUMMARY OF THE INVENTION

The present invention is a digital comparator circuit which readily lends itself to being constructed by metal oxide semiconductor field-effect transistor (MOSFET) techniques on a monolithic semiconductor substrate. More particularly, the comparator circuit includes a series of exclusive OR gates, each of which accepts one bit from each of the two binary words to be compared. The exclusive OR gates will provide an output signal when the bits being compared are not the same. The outputs from the exclusive OR gates are applied to a MOSFET NOR gate. The NOR gate will provide an output signal when all bits of the two binary words are the same.

DESCRIPTION OF THE DRAWINGS

The above and other novel features and advantages of the invention will become more apparent from the following detailed description when taken in conjunction with the accompanying drawing which is a diagram illustrating a digital comparator circuit embodying features of the present invention.

DESCRIPTION OF THE PREFERRED EMBODIMENT

The digital comparator circuit will be described in terms of a negative logic system where ground voltage level indicates a logic 0 and a relatively negative voltage level indicates a logic 1. It should be understood that a positive logic system could be used with appropriate changes in the supply voltages applied to the circuitry with an enhancement mode P-type substrate. All parts of the circuit can be constructed on one semiconductor substrate using standard MOSFET techniques. The MOSFET circuit is constructed to operate in the enhancement mode with an N-type substrate. This means that for a MOSFET to conduct, the gate voltage must be negative with respect to the source voltage. The logic levels used for the circuit are ground to indicate a logic 0 and a relatively negative voltage which may be −15 v., for example, to indicate a logic 1. The drain supply voltage $-V_{DD}$ is at the logic 1 voltage level. The gate supply voltage $-V_{GG}$ for the MOS field-controlled resistors is more negative than $-V_{DD}$ and may be at −30 v., for example. This means that for a MOSFET to conduct, a logic 1 ($-V_{DD}$ will be applied to the gate of the MOSFET.

Referring now to the FIGURE, there is shown a four-bit comparator circuit which will compare bits from binary word A and binary word B. The comparator circuit includes four parallel exclusive OR gates, 10, 12, 14 and 16. Each exclusive OR gate compares pairs of the same significant bits from each of the binary words. For example, exclusive OR gate 10 compares bit A1 from binary word A with bits B1 from binary word B. Exclusive OR gate 12 compares bit A2 and bit B2. Exclusive OR gate 14 compares bit A3 and bit B3. Exclusive OR gate 16 compares bit A4 and bit B4. The outputs C1, C2, C3 and C4 of the exclusive OR gate circuits are applied in parallel to a NOR gate 18. If all of the bits compare, the NOR gate 18 will provide a logic 1 output signal at terminal D.

It should be understood that the comparator circuit may be expanded to include any number of bits desired by adding exclusive OR gate circuits for each additional bit to be compared and adding an additional input to the NOR gate 18.

The detailed operation of the exclusive OR gates will now be described. The exclusive OR gates operate according to the following truth table:

| A | B | Output |
|---|---|---|
| 0 | 0 | 0 |
| 0 | 1 | 1 |
| 1 | 0 | 1 |
| 1 | 1 | 0 |

When both inputs to the exclusive OR gate are the same, that is, both at logic 0 or both at logic 1, the output of the exclusive OR gate will be at logic 0. When the inputs to the exclusive OR gate are not both the same, the output will be at logic 1. Taking the first case where both inputs A1 and B1 are at logic 0, the logic 0 from the A1 input will be applied to the gate of a MOSFET 20 and the gate of a MOSFET 22. With logic 0 applied to the gates of these MOSFETS, they will not conduct. Logic 0 from input B1 will be applied to the gate of a MOSFET 24 and the gate of a MOSFET 26 and will prevent MOSFETs 24 and 26 from conducting. With MOSFETs 20 and 24 not conducting, logic 1 ($-V_{DD}$) will be applied through a MOS field-controlled resistor 28 and to the gate of a MOSFET 30. With MOSFET 30 conducting, a current path to ground will be established through the signal terminals of MOSFET 30 which will put the output C1 of the exclusive OR gate 10 to logic 0. It should be understood that the MOS field-controlled resistors 28 and 32 have a fixed voltage ($-V_{GG}$) applied to their gates so that they operate as conventional resistors.

The next case is where input A1 is at logic 0 and input B1 is at logic 1. Logic 0 from input A1 will be applied to the gates of MOSFETs 20 and 22 and these MOSFETs will be nonconducting. With input B1 at logic 1, logic 1 will be applied to the gates of MOSFETs 24 and 26 and will allow these MOSFETs to conduct. Since MOSFET 26 is in series with MOSFET 22 and MOSFET 22 is nonconducting, the fact that MOSFET 26 is conducting will not affect the output C1 of the circuit. However, since MOSFET 24 is now conducting, a conducting path to ground will be established through the signal terminals of MOSFET 24 and logic 0 will be applied to the gate of the MOSFET 30 and MOSFET 30 will not conduct. Since there is no path to ground for the output C1 of the exclusive OR gate 10, the logic 1 ($-V_{DD}$) will be applied through a MOS field-controlled resistor 32 to the output C1 of the exclusive OR gate 10.

The third condition is where input A1 is logic 1 and input B1 is logic 0. Logic 1 will be applied from input A1 to the gates of MOSFET 20 and MOSFET 22. This will allow these MOSFETs to conduct. Logic 0 will be applied from input B1 to the gates of MOSFETs 24 and 26. This will prevent MOSFETS 24 and 26 from conducting. Now, since nonconducting MOSFET 26 is in series circuit relationship with MOSFET 22, the fact that MOSFET 22 is conducting will not affect the output C1 of the circuit. However, MOSFET 20 is conducting and will establish a conducting path to ground through its signal terminals and logic 0 will be applied to the gate of MOSFET 30. This will prevent MOSFET 30 from conducting. We now have no conducting path to ground for the output C1 of the exclusive OR gate 10 and logic 1 ($-V_{DD}$) will be applied through the MOS field-controlled resistor 32 to the output C1 of the exclusive OR gate 10.

The last condition is where input A1 and input B1 are both at logic 1. In this case, MOSFETs 20, 22, 24 and 26 will all have logic 1 applied to their gates and all of these MOSFETs will conduct. Since MOSFET 20 and MOSFET 24 are conducting, a conducting path to ground will be established through the signal terminals of these MOSFETS and logic 0 will be applied to the gate of MOSFET 30 and prevent MOSFET 30 from conducting. However, MOSFETs 22 and 26 are both conducting, which will establish a conducting path to ground through the signal terminals of these MOSFETs and logic 0 will be applied to the output C1 of the exclusive OR gate 10.

The detailed operation of the remaining exclusive OR gates 12, 14 and 16 is substantially identical to the operation of the exclusive OR gate 10.

The operation of the NOR gate 18 will now be described. Recall that a logic 1 output signal is desired at terminal D when all bits A1 through A4 compare with bits B1 through B4. If any pair of bits do not compare, a logic 0 signal is desired at terminal D. The outputs C1, C2, C3 and C4 of the exclusive OR gates 10, 12, 14 and 16 respectively are applied in parallel to the gates of parallel MOSFETs 40, 42, 44 and 46 respectively. If the output signal of any of the exclusive OR gates is logic 1 ($-V_{DD}$) indicating that bits do not compare, it will allow the associated MOSFET of the NOR gate 18 to conduct and will establish a conducting path to ground through the MOSFET signal terminals for the output terminal D which will apply logic 0 to output terminal D. If the outputs C1 through C4 of all of the exclusive OR gates are logic 0 (ground), which indicates that all bits compare, none of the MOSFETs of the NOR gate 18 will conduct and logic 1 ($-V_{DD}$) will be applied through a MOS field-controlled resistor 48 to the output terminal D. It should be understood that the MOS field-controlled resistor 48 has a fixed voltage ($-V_{GG}$) applied to its gate so that it operates as a conventional resistor.

As noted above, the MOSFET binary comparator circuit is not restricted to four bits. Any number of bits may be compared with the addition of an additional parallel exclusive OR gate and one additional parallel MOSFET as part of the NOR gate 18 for each additional pair of bits to be compared.

What is claimed is:

1. A comparator circuit for comparing individual bits in two digital words of the type that can be constructed on a monolithic semiconductor substrate by metal oxide semiconductor field-effect transistor techniques which comprises:

a plurality of MOSFET exclusive OR gates each coupled to receive pairs of bits in the same significant bit positions from each of the two digital words, said MOSFET exclusive OR gates each providing an output signal having a first signal level when the bits are not the same and having a second signal level when the bits are the same; and a MOSFET NOR gate coupled to receive the output signals from said plurality of MOSFET exclusive OR gates for providing an output signal having a first signal level only when all of the output signals of said plurality of MOSFET exclusive OR gates are at the second signal level and having a second signal level when any of the output signals of said plurality of MOSFET exclusive OR gates are at the first signal level.

2. A MOSFET comparator circuit as claimed in claim 1 wherein each of said plurality of MOSFET exclusive OR gates comprises:

first and second MOSFETs interconnected in series circuit relationship for conducting the second signal level to the output when both bits are at the first signal level;

a third MOSFET interconnected in parallel circuit relationship with said first and second MOSFETs for conducting the second signal level to the output when a first signal level is applied to its gate;

a first MOS field-controlled resistor interconnected in series circuit relationship with said first and second MOSFETS and said third MOSFET for applying the first signal level to the output when the second signal level is not being conducted to the output by the first and second MOSFETs or the third MOSFET;

fourth and fifth MOSFETs interconnected in parallel circuit relationship for conducting the second signal level to the gate of said third MOSFET when either of the bits are at the first signal level;

a second MOS field-controlled resistor interconnected in series circuit relationship with said fourth and fifth MOSFETs for applying the first signal level to the gate of said third MOSFET when both bits are at the second signal level.

3. A MOSFET comparator circuit as claimed in claim 1 wherein said MOSFET NOR gate comprises:

a plurality of MOSFETs interconnected in parallel circuit relationship, each of said plurality of MOSFETs being associated with an individual one of said plurality of MOSFET exclusive OR gates and being operable to conduct the second signal level to the output of said MOSFET NOR gate when the output of its associated MOSFET exclusive OR gate is at the first signal level; and a MOS field-controlled resistor for applying the first signal level to the output of said MOSFET NOR gate when all outputs of said plurality of MOSFET exclusive OR gates are at the second signal level.